United States Patent
Broderick

(10) Patent No.: US 12,316,347 B2
(45) Date of Patent: May 27, 2025

(54) SELF HEALING SCRIPTS FOR SCANNING DEVICE

(71) Applicant: Infinite Peripherals, Inc., Irvine, CA (US)

(72) Inventor: John Broderick, Corona, CA (US)

(73) Assignee: Infinite Peripherals, Inc., Irvine, CA (US)

( * ) Notice: Subject to any disclaimer, the term of this patent is extended or adjusted under 35 U.S.C. 154(b) by 0 days.

(21) Appl. No.: 18/215,965

(22) Filed: Jun. 29, 2023

(65) Prior Publication Data

US 2025/0007536 A1   Jan. 2, 2025

(51) Int. Cl.
| | |
|---|---|
| *H03M 13/13* | (2006.01) |
| *G06F 3/00* | (2006.01) |
| *G06F 3/0487* | (2013.01) |
| *H03M 13/00* | (2006.01) |

(52) U.S. Cl.
CPC .......... *H03M 13/13* (2013.01); *G06F 3/0487* (2013.01); *H03M 13/611* (2013.01)

(58) Field of Classification Search
CPC .... H03M 13/13; H03M 13/611; G06F 3/0487
See application file for complete search history.

(56) References Cited

U.S. PATENT DOCUMENTS

| | | | | |
|---|---|---|---|---|
| 10,741,059 | B2 * | 8/2020 | Moore | G08B 29/02 |
| 11,131,987 | B2 * | 9/2021 | Wang | G06V 20/00 |
| 11,200,820 | B2 * | 12/2021 | Nakamura | G09G 5/397 |
| 11,526,390 | B2 * | 12/2022 | Mead | G06T 1/0021 |
| 11,961,434 | B2 * | 4/2024 | Jeong | G09G 5/003 |
| 2014/0063042 | A1 * | 3/2014 | Hernandez | G06F 8/38 345/592 |
| 2016/0071231 | A1 * | 3/2016 | Bargh | G09G 5/36 345/520 |
| 2016/0195408 | A1 * | 7/2016 | Block | G01C 23/00 340/945 |
| 2019/0213866 | A1 * | 7/2019 | Moore | G08B 25/002 |
| 2019/0286115 | A1 * | 9/2019 | Wang | G06F 9/3877 |

* cited by examiner

*Primary Examiner* — Justin R Knapp
(74) *Attorney, Agent, or Firm* — Sterne, Kessler, Goldstein Fox, P.L.L.C.

(57) ABSTRACT

Systems, methods, and non-transitory computer readable media are disclosed for error detection and correction on a mobile device. The error detection and correction is performed using the GUI screens of the mobile device to detect whether the mobile device is in an error state. This is done through segmenting any given GUI screen to determine what the screen indicates, and whether the GUI screen maps to an expected screen. This can be done without the use of operating system level information or error logs. If errors are detected scripts can be run to correct the errors.

27 Claims, 6 Drawing Sheets

SELF HEALING SCRIPTS FOR SCANNING DEVICE

BACKGROUND

Field

This field is generally related to scanning devices.

Related Art

Scanning devices (also referred to herein as mobile scanning devices, mobile devices, or devices), such as ring scanners, mobile phones with scanning capabilities, tablets with scanning capabilities, etc. have graphical user interface (GUI) screens that can indicate the status of the devices. Based on what the GUI screens show, users of devices can determine if the devices are in an error mode. For example, a GUI screen can have an error message displayed indicating that a communication has failed to send its intended message. Typically, when error messages such as these are displayed, users contact a help desk and/or an information technology (IT) professional to help resolve the error. Typically, the help desk/IT professional can attempt to resolve the error by following a protocol and/or access logs of the mobile scanning device to see what the source of the error is in an attempt to resolve/troubleshoot the error.

The aforementioned process has several problems. First, when hundreds or thousands of devices are deployed, the aforementioned process does not scale in instances where the devices are afflicted with the same error. In these instances, help desks/IT professionals can be inundated with calls, which can cause delays in error resolution. Second, operating system (OS) providers can limit access to error logs required to resolve the errors. The limitations are often the result of security measures taken by the OS providers to limit access to internal workings of the OS to prevent nefarious actors from using the information from error logs for illicit purposes.

Thus, solutions are needed to allow errors to be resolved on a mass scale, and to bypass any limitations placed on the OS so that device errors can be resolved efficiently and quickly.

BRIEF SUMMARY

Systems, methods, and non-transitory computer readable media are disclosed for error detection and correction on a mobile device. The system, methods, and non-transitory computer readable media provide a novel way to detect and correct errors in that they only use the GUI screens to detect whether the mobile device is in an error state. This is done through segmenting any given GUI screen to determine what the screen indicates, and whether the GUI screen maps to an expected screen. For example, it may be that for a given time (e.g., prior to 8 AM), the mobile device is expected to be on a "Welcome" screen indicating that the device is ready to use. However, if the segment of the GUI screen indicates an error message, the device can, by itself, determine that it is in an error state and attempt to resolve the error by performing an error correction. In aspects, the error correction can include executing a script (also referred to herein as a self-healing script). In aspects, the script can perform one or more actions to perform the error correction. For example, the one or more actions can include deleting, reinstalling, pausing, or restarting software programs on the mobile device to perform the error correction. In aspects, the script can perform these actions in a specific or pre-defined sequence. The aforementioned are exemplary of the one or more actions. A person of ordinary skill in the art (POSA) reading this disclosure will know what types of scripts can be executed to perform error correction based on the examples given throughout.

The scripts can be pre-written and in scripting languages such as JavaScript™. The scripts can be written by, for example, an administrator implementing the system and can be stored on the device itself. In aspects, each error screen or error status can be pre-indexed and can have a script mapped to it such that when the error screen or error status is detected, the script associated with the error screen or error status can be executed to resolve the specific error.

The system is novel in that it implements a way to resolve the outstanding issues of relieving the burden on help desk/IT professionals to resolve errors, and it also does this in an independent and autonomous way. It can avoid using OS components that may be restricted. Thus, the system, method, and non-transitory computer readable media can be detached from dependencies needed for error detection (e.g., can be independent of the OS to detect errors).

In aspects, the system, method, and non-transitory computer readable media can perform the aforementioned functionality by defining an area on a graphical user interface (GUI) screen of the mobile device, where the area is defined by a number of pixels within the area. A cyclic redundancy check (CRC) or other error detection function on the area can be performed to obtain a value representing the GUI screen. A determination can be made if the value matches an expected value of an expected GUI screen of the mobile device. If determined that the GUI screen does not match the expected GUI screen, a script can be executed to perform an error correction.

In aspects, the script can be stored on the mobile device and executed by a mobile device management (MDM) software of the mobile device. In aspects, the script itself can be provided to the mobile device via a device management server running a portion of the MDM software. The MDM software refers to a software used to administer the mobile device. MDM software is typically a deployment of a combination of on-device applications and configurations, policies and certificates, and backend infrastructure, for the purpose of simplifying and enhancing the IT management of end user devices. In aspects, the MDM software can be used to manage the mobile device remotely via a console. The console allows an administrator to control, secure, and enforce policies, and install and uninstall applications on the mobile device. The MDM software can be used to manage groups of mobile devices. In this way, aspects provide remote management of a whole group of mobile devices.

In aspects, in order to be managed by the MDM software, mobile devices can enroll or have a client side portion of the MDM software installed on them to become a device managed by a device management server, on which a server side portion of the MDM software is installed. The various services provided by device management server may include: (i) ensuring that devices are configured to a consistent standard and supported set of applications, functions, or corporate policies, (ii) updating applications, functions, or policies installed on devices, (iii) ensuring that users use devices in a consistent and supportable manner, (iv) ensuring that devices operate correctly (diagnosing and troubleshooting devices), and (v) monitoring and tracking devices (e.g. location, status, ownership, activity). Device management server may provide the management services to the devices via a push message over a network. A POSA will be familiar with MDM software so further details of the MDM software will not be discussed extensively in this disclosure.

In aspects, the value representing the GUI screen can be a numerical value. In aspects, this value can be made more user friendly by classifying it and mapping it to a textual description of the GUI screen. For example, a "Welcome" screen can be represented by the numerical value of "2572461359". The numerical value is obtained as the output of the CRC that is run on the area of the GUI screen. More will be discussed about this process below. For the purposes of discussion, it is assumed that the GUI screen is represented by the numerical value. In aspects, this numerical value can be translated to a textual description of what the GUI screen represents, which in this case is the "Welcome" screen. Thus, instead of referring to the GUI screen by its numerical value in scripts, it can be referred to as "Welcome Screen" or something similar to make it more user friendly when writing scripts to correct errors associated with the screen.

In aspects, the script can perform one or more actions to perform the error correction. In aspects, the one or more actions can include at least deleting, reinstalling, pausing, or restarting software programs on the mobile device to perform the error correction.

BRIEF DESCRIPTION OF THE DRAWINGS

The accompanying drawings, which are incorporated herein and form part of the specification, illustrate the present disclosure and, together with the description, further serve to explain the principles of the disclosure and to enable a person skilled in the relevant art to make and use the disclosure.

The drawing in which an element first appears is typically indicated by the leftmost digit or digits in the corresponding reference number. In the drawings, like reference numbers may indicate identical or functionally similar elements. The drawings are illustrative and may not be to scale.

DETAILED DESCRIPTION

Device Architecture

Figure 1A:
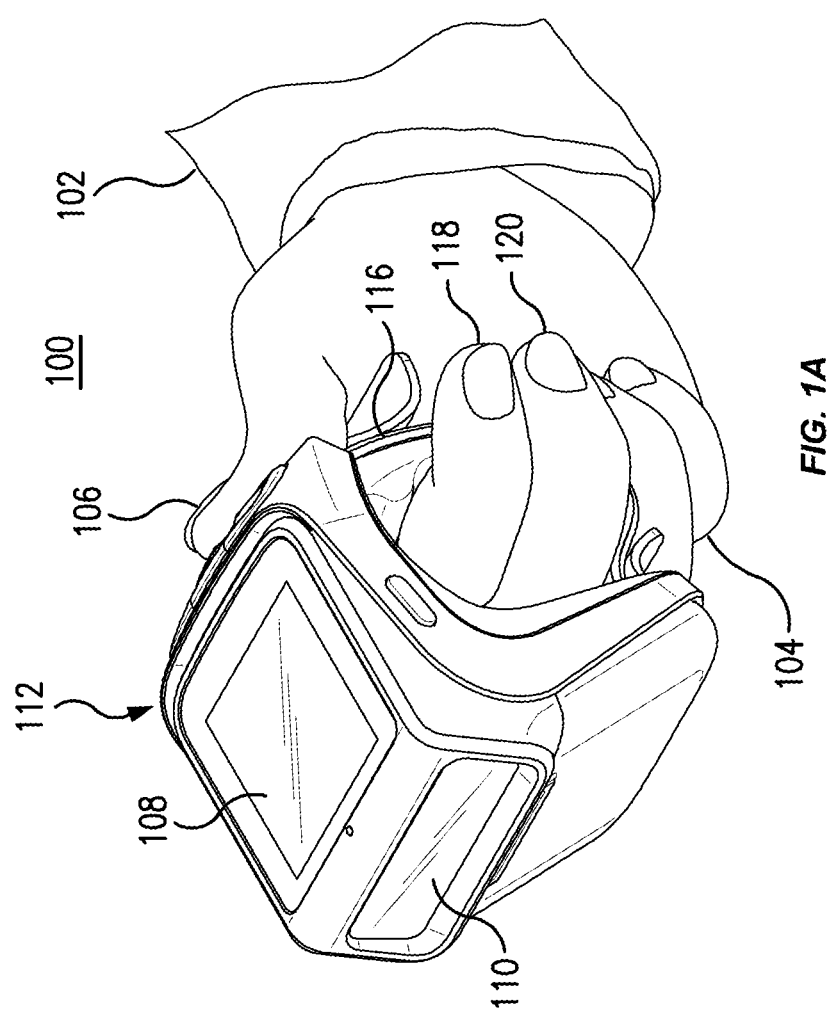
FIGS. 1A and 1B are diagrams illustrating a ring scanner as a representative mobile device, according to aspects.
Figure 1B:
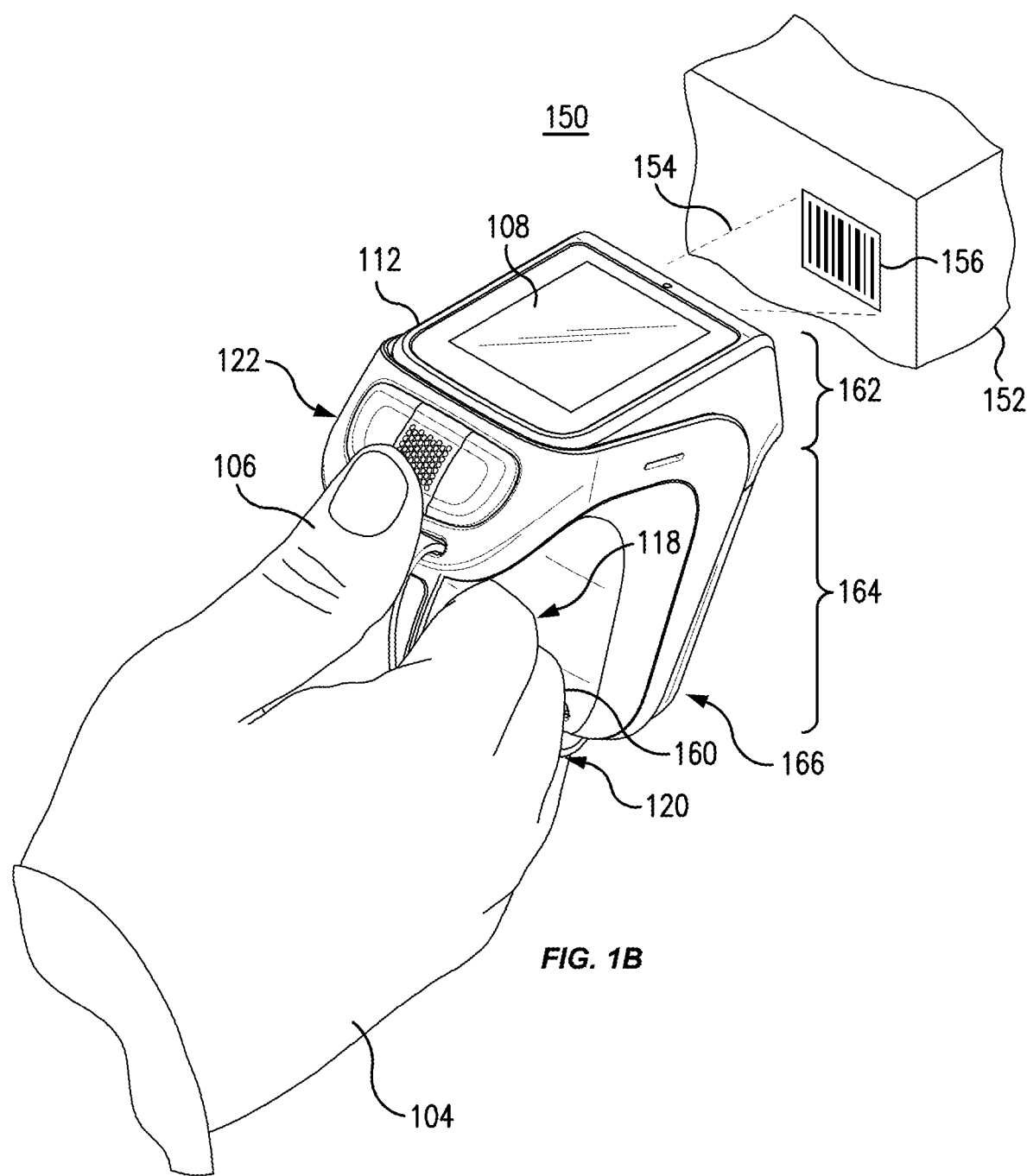

FIGS. 1A and 1B are diagrams illustrating a ring scanner 112, according to aspects. The ring scanner 112 is representative of the type of mobile scanning device that the disclosed embodiments are to be performed on. This, however, is exemplary, and other types of mobile devices such as mobile phones or tablet computers can also be used. The typical use case for the disclosed embodiments will have the processes for error detection and correction run on one or more of these exemplary mobile devices to enable the mobile devices to self-heal or correct errors that are detected using information from the GUI screens of the mobile devices.

FIG. 1A shows a diagram 100 with a user/operator having a hand 104 and forearm 102. Hand 104 is gripping the ring scanner 112. Ring scanner 112 has a display 108 and an optical scanner 110.

As may be seen in diagram 100, ring scanner 112 has a loop 116 through which an index finger 118 and a middle finger 120 pass through to grip and hold ring scanner 112. Loop 116 is configured to be gripped by index finger 118 and middle finger 120. It presses against the palmar side of index finger 118 and middle finger 120. Because loop 116 enables an operator to grip ring scanner 112 with just a loop around the operator's fingers, the operator maintains use of his or her hands. For example, the operator can continue to use his or her hands to operate equipment, carry packages, and climb ladders.

According to an aspect, loop 116 is configured to be gripped by index finger 118 and middle finger 120 such that the palm is in a neutral position when the optical detector is oriented in an upright direction. In this way, a user need not pronate the hand when transitioning from using the hand to grip a package from the package's side to scanning the optical label. The user's forearm 102 need not twist when scanning. Avoiding twisting in this way, the operator can avoid fatigue, discomfort, pain, and even possible injury.

Display 108 is an output device for presentation of information in visual form. It outputs information that is supplied to it from a computing device (not shown) in ring scanner 112, converting electrical signals into light. In different aspects, display 108 may be an electroluminescent (ELD) display, liquid crystal display (LCD), light-emitting diode (LED) backlit LCD, thin-film transistor (TFT) LCD, light-emitting diode (LED) display, OLED display, AMOLED display, plasma (PDP) display, quantum dot (QLED) display, or electronic paper, such as E INK paper available from E Ink Corporation of Cambridge, Massachusetts.

Optical scanner 110 is an optical scanner that can read printed optical labels such as barcodes or can scan images of objects or take pictures of the objects, decode the data contained in the optical label, and send the data to a computer. It may include a light source, a lens, and a light sensor translating for optical impulses into electrical signals. In different aspects, optical scanner 110 may be a pen-type reader, a laser scanner, a charge-coupled device (CCD) reader, a light emitting diode (LED) scanner, a camera-based reader, a video camera reader, a large field-of-view reader, or an omnidirectional barcode scanner.

FIG. 1B shows a diagram 150 illustrating ring scanner 112 from a different perspective. As shown in diagram 100, ring scanner 112 is in this position to project light 154 to capture a barcode 156 on package 152.

As shown in diagram 150, barcode 156 is oriented in a horizontal direction, read left to right or right to left. Barcode 156 is a linear dimensional (1D), one dimensional barcode with its lines running vertical to ground. In other aspects, barcode 156 may be two-dimensional and use rectangles, dots, hexagons and other patterns. In other aspects, the package 152 itself may be scanned as an image/picture.

As shown in diagram 150, when positioned to capture barcode 156 in an upright direction the user's palm of hand 104 hand is oriented substantially vertically. The palm of hand 104 is orthogonal to the ground.

As shown in diagram 150, ring scanner 112 includes a body piece 166, which includes an upper body portion 162 and a lower body 164. Upper body portion 162 rests on a portion of index finger 118 facing a thumb 106 of hand 104. Lower body 164 covers a dorsal side of index finger 118 and middle finger 120 of hand 104. Upper body portion 162 and lower body 164 are affixed to one another and angled to cover at least a portion of the thumb-facing side of index finger 118 and the dorsal side of middle finger 120. Together with loop 116, upper body portion 162 and lower body portion 164 encircle index finger 118 and middle finger 120. More specifically, together with loop 116 (labeled in FIG. 1A), upper body portion 162 and lower body 164 may encircle a middle phalanx portion index finger 118 and middle finger 120.

Upper body portion 162 includes a plurality of buttons 122 that, when selected, causes ring scanner 112 to perform certain actions. Each of the plurality of buttons 122 may be a switch mechanism with a surface that may be depressed, or pushed, by a finger. When the surface is depressed an electrical signal is sent to input information and possibly trigger an action. Each of the plurality of buttons 122 may have a spring to return to their un-pushed state. Other types of buttons may be used as well, such as virtual buttons presented on a touchscreen display.

As will be described below, the plurality of buttons 122 may cause optical scanner 110 to activate and scan barcode 156 or may input data into a computing device controlling aspects of ring scanner 112. The plurality of buttons 122 are positioned on ring scanner 112 to be selected by thumb 106.

In particular, buttons 122 are positioned to be selected by thumb 106 when hand 104 is gripping a ring scanner 112, and index finger 118 and middle finger 120 are bent. According to an aspect, buttons 122 are positioned to be selected when index finger 118 and middle finger 120 are bent at a proximal interphalangeal joint 160. Proximal interphalangeal joint 160 sits between a middle phalanx and proximal phalanx of index finger 118 and middle finger 120. Bending at proximal interphalangeal joint 160 may be more ergonomical than bending other joints, such as the metacarpophalangeal joint of index finger 118 and middle finger 120.

Display 108 may be a touchscreen display. A touchscreen display is an assembly of both an input (touch panel) and output (display) device. The touch panel may be layered on the top of the output electronic visual display. A user can give input or control a computing device (not shown) in ring scanner 112 through simple or multi-touch gestures by touching the screen with a special stylus or one or more fingers. In different examples, a touch panel may be a resistive touchscreen panel, a surface acoustic wave (SAW) touch panel, a capacitive touchscreen panel, or an infrared touchscreen panel.

When display 108 is a touchscreen display, display 108 will also be positioned such that at least a portion of display 108 may be selected by thumb 106 when hand 104 is gripping a ring scanner 112, and index finger 118 and middle finger 120 are bent at the proximal interphalangeal joint 160. Display 108 is configured to output visually from the computing device.

Figure 2:
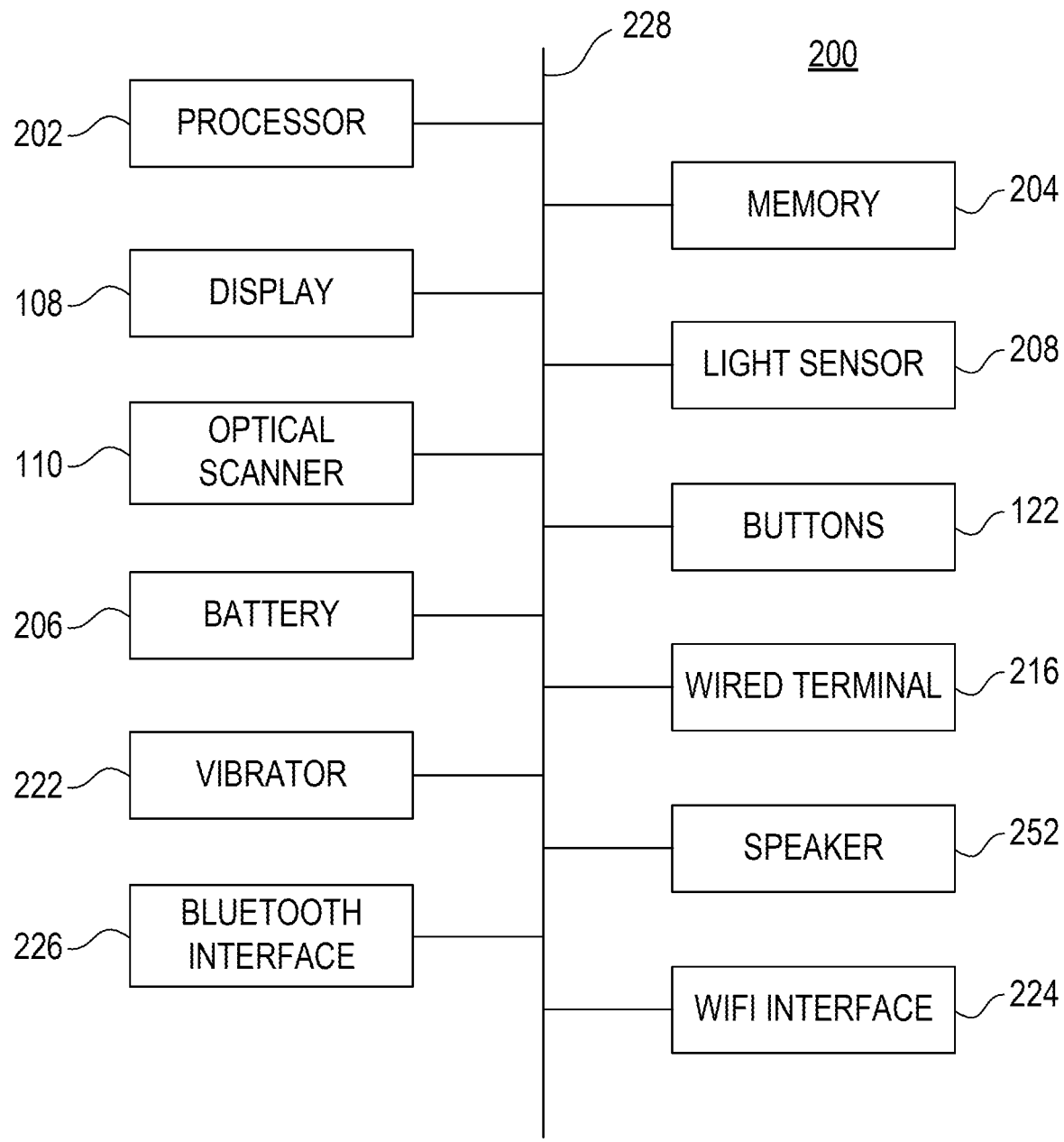
FIG. 2 is an architecture diagram illustrating hardware components of the ring scanner, according to aspects.

FIG. 2 is an architecture diagram 200 illustrating hardware components of the ring scanner 112, according to aspects. Diagram 200 includes display 108, optical scanner 110, buttons 122, battery 206, and speaker 252. In addition to those components, diagram 200 includes a processor 202, memory 204, light sensor 208, wired terminal 216, vibrator 222, Bluetooth interface 226 and Wi-Fi interface 224. Each of these components of FIG. 2 is enclosed within a housing of the ring scanner 112.

Bus 228 is a communication system that transfers data between the hardware components of a ring scanner 112. In addition to transferring data, Bus 228 may also transfer electrical power, such as from a battery 206 to other components. In this way, Bus 228 communicatively and electrically couples the various components.

It may be appreciated for those skilled in the art that a plurality of signal lines or buses may exist, thus different components may be linked by different signal lines or buses, and that a signal line or bus depicted in the schematic diagram may represent a plurality of such. Memory 204 may include random access memory (RAM) and may also include nonvolatile memory, such as read only memory (ROM) and/or flash memory. Memory 204 may be embodied as an independent memory component, and may also be embedded in another component, such as processor 202, or may be embodied as a combination of independent as well as embedded, and/or a plurality of memory components is present, the invention is not so limited. Memory 204 is adapted to include software modules (a module is a set of instructions).

Processor 202 is adapted to run instructions stored in memory 204. Processor 202 may be a micro-controller unit (MCU), a digital signal processor (DSP) and/or an Image/Video Processing unit or the like components that run instructions. An example of an MCU is MSP432P401x, available from Texas Instruments Inc. of Dallas, Texas. An example of a DSP is C5000, available from Texas Instruments Inc. An example of an image/video processor is OMAP3525, available from Texas Instruments Inc. One or more processors may be present. Processor 202 may be an independent component, it may also be embedded in another component, such as in light sensor/camera 208, or any combination thereof.

Wired terminal 216 is adapted to attach to a wired network, including, but not limited to, Ethernet, USB or thunderbolt.

Diagram 200 includes two wireless interfaces, Wi-Fi interface 224 and Bluetooth interface 426. Wi-Fi interface 224 may provide a network interface accessible by applications running on processor 202. Bluetooth interface 226 may be adapted to enable the ring scanner 112 to interact with peripheral devices, such as headsets (not shown).

Light sensor 208 is a photodetector. It is a sensor of light. A photo detector has a p-n junction that converts light photons into current. The absorbed photons make electron-hole pairs in the depletion region. Photodiodes and phototransistors are a few examples of photo detectors. In a different example, light sensor 208 may be a photoemission or photoelectric effect photodetector, thermal photodetectors, polarization photodetectors, or photochemical photodetectors. Light sensor 208 may be integrated into a camera of the ring scanner 112.

In an example operation, light sensor 208 may signal to processor 202 when light is detected. Processor 202, in turn, may adjust the brightness of display 108. Automatically adjusting brightness in this way may have the effect of conserving power in battery 206.

Vibrator 222 is a device that causes vibration when receiving a specified signal from processor 202. Vibrator 222 is a mechanical device to generate vibrations. To generate the vibrations, vibrator 222 may include an electric motor with an unbalanced mass on its driveshaft. Vibrator 222 may be a vibrating structure gyroscope implemented as a microelectromechanical system (MEMS).

Speaker 252 is coupled to processor 202 and is configured to cause the ring scanner 112 to emit sound as specified by commands from processor 202. In this way, speaker 252 may provide audio to a user of the ring scanner 112 as specified by an application executed on processor 202.

The buttons 122 may send commands to the processor 202, or other components such as optical scanner 110. When a user presses one of buttons 122, a signal may be sent to processor 202. That signal may cause an interrupt command in the software application executed by processor 202, causing processor 202 to run specific commands that an application specifies to correspond to that button input. In this way, using buttons 122, a user can trigger actions as specified by the application executed by processor 202.

In response to inputs it receives from buttons 122, processor 202 can output information to display 108 as specified by a software application executed by processor 202. In addition, as mentioned above, display 108 may be a touchscreen display. In this way, interactive applications may be implemented within the ring scanner 112.

In addition, not shown, other input devices may be included, such as a radiofrequency identification (RFID) reader and a near field communication (NFC) reader. RFID uses electromagnetic fields to automatically identify and track tags attached to objects. An RFID system consists of a tiny radio transponder, a radio receiver and transmitter. When triggered by an electromagnetic interrogation pulse from RFID reader, an RFID tag transmits digital data back to the reader. A NFC reader may allow for collection of payment data from an EMV chip or from a user's mobile device (not shown).

In examples, these NFC and RFID readers may be used for login purposes. An operator can swipe her badge in vicinity of a ring scanner 112 having these features and the ring scanner 112 can log her in using the information received from the NFC chip or the badge. Then, when the operator is using the ring scanner 112, any scanned items are tracked with an identification of the operator who logged into the ring scanner 112.

Error Detection and Correction

FIGS. 3A, 3B, 4A, and 4B show how the embodiments disclosed segment a GUI screen of the display 108 of the ring scanner 112 to determine if the GUI screen matches an expected GUI screen, according to aspects. The functions described with respect to FIGS. 3A, 3B, 4A, and 4B can be executed by a portion of the MDM software installed on the ring scanner 112. The MDM software can be executed by one or more computing devices of the ring scanner 112 (e.g., processor 202) to perform the functions. Box 304 shows a sample code that can be executed by the MDM software to perform the functions.

As indicated previously, the segmentation of the GUI screen allows the ring scanner 112 to self-determine whether it is in an error state, and to determine what type of error state it is in without needing to access error logs of the OS. If the ring scanner 112 determines that it is in an error state, the ring scanner 112 can attempt to auto-correct the error by executing a script customized to resolve the particular error.

In aspects, the segmenting can define an area 302 on the GUI screen. The area 302 can be defined using pixels of the screen. In FIGS. 3A, 3B, 4A, and 4B the area 302 is defined as the 200 pixel by 100 pixel area shown in the middle of the GUI screen. This is exemplary, and any segmentation of the GUI screen can be used. In aspects, how the area 302 is defined can be based on a known format of the GUI screen. For example, the area 302 can be chosen based on an expected text or graphic that is expected in that area 302. For example, it can be known that the area 302 has a particular type of text that is expected to be within area 302. The text can be used to identify whether the GUI screen is an expected screen. For example, in FIG. 3A, it can be known that area 302 should have the text "WELCOME YOUR DEVICE IS READY TO USE. PLEASE REMOVE YOUR DEVICE FROM THE CRADLE" within the area 302. This text can be used to determine whether the GUI screen is showing what it is supposed to show.

Figures 3A, 3B:
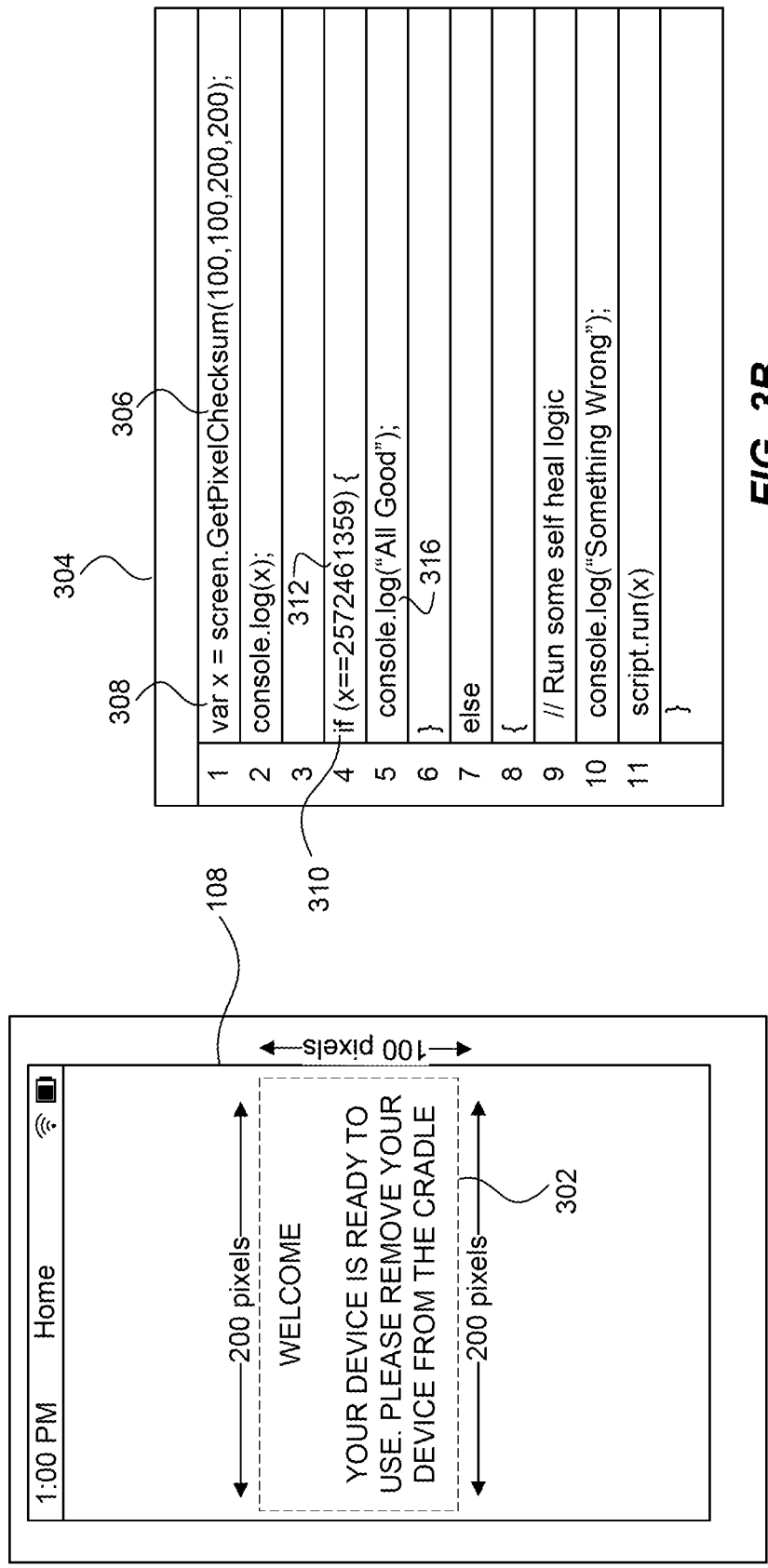
FIGS. 3A, 3B, 4A, and 4B show how embodiments disclosed segment a GUI screen of a display of the ring scanner to determine if the GUI screen matches an expected GUI screen, according to aspects.

In aspects, once the area 302 is defined, an error detecting function can be run on the area 302 to obtain a value 308 representing the GUI screen. The error detecting function can be for example, a cyclic redundancy check (CRC), a checksum, a check digit code, fingerprinting code, lossy compression functions, randomization functions, error-correcting codes, and ciphers. In FIG. 3A, the function performing the error detecting function is shown by 306. The function takes in the pixels defining the area 302 as inputs and performs the error detecting on the area 302. The function then outputs a value 308 based on the computations performed by the error detection. The value 308 can be a number. The value 308 can represent the GUI screen. In aspects, the value 308 can be made more user friendly by classifying it and mapping it to a textual description of the GUI screen. For example, a "Welcome" screen can be represented by the numerical value of "2572461359". In aspects, this value 308 can be translated to a textual description of what the GUI screen represents, which in this case is the "Welcome" screen. Thus, instead of referring to the GUI screen by its value 308 in scripts, it can be referred to as "Welcome Screen" or something similar to make it more user friendly when writing scripts to correct errors associated with the screen.

In aspects, once the value 308 is obtained, it can be matched/compared to a known value 312 for a GUI screen. The matching/comparing is to determine if the value 308 matches the known value 312 such that the GUI screen displayed is displaying what is expected to be displayed. The known value 312 can represent the expected GUI screen. For example, in FIG. 3B, the known value 312 is shown as "2572461359," and can represent the "Welcome" screen. If the value 308 matches the known value 312, a signal and/or message can be generated indicating that no error correction is needed because the GUI screen is showing what it is supposed to show, which is the "Welcome" screen. In aspects, the signal and/or message can be sent to a log file or displayed to an administrator implementing the system. In FIG. 3B, function call 316 is an example function that can generate the signal and/or message.

Figures 4A, 4B:
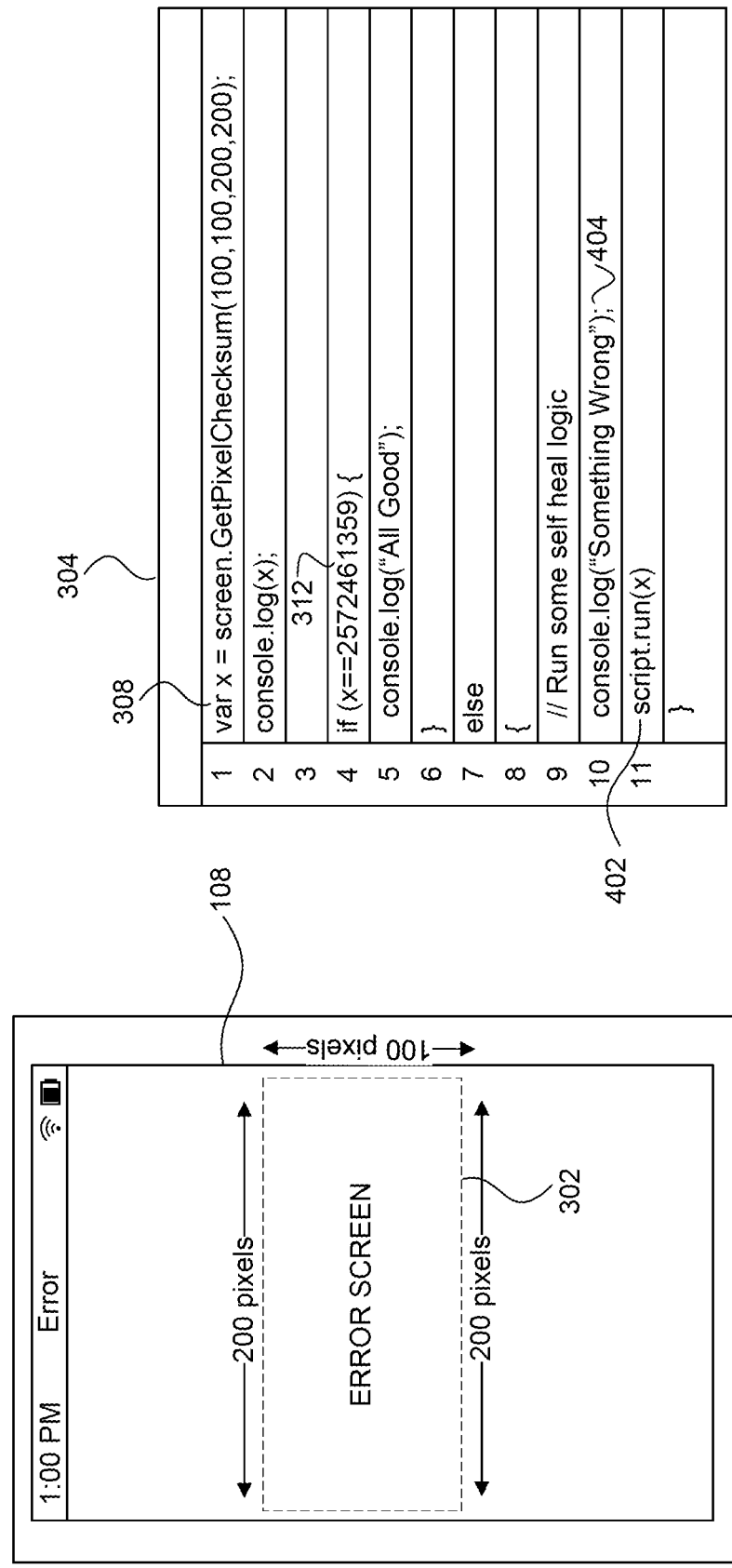

FIGS. 4A and 4B show a scenario where the GUI screen does not match the expected screen. Thus, in this case the value 308 does not match the known value 312, thus indicating that the ring scanner 112 is in an error state. As a result, the "else" portion of the if-else statement shown in FIGS. 3B and 4B is invoked, and a script 402 is executed in an attempt to correct the error. For example, the script 402 can attempt to correct the error shown by attempting to recover the "Welcome" screen, that is expected. In aspects, the script 402 can be customized to perform such a recovery. In aspects, in order to recover the "Welcome" screen, script 402 can perform one or more actions. The one or more actions can include at least deleting, reinstalling, pausing, or restarting software programs to recover the "Welcome" screen. In aspects, the script 402 can perform the one or more actions in a specific or pre-defined sequence. The script 402 can be written with various error scenarios in mind such that it can account for the various types of errors that may exist. For example, the script 402 may detect a particular type of error by taking the value 308 in as an input variable and matching it to known error states by comparing the value 308 to values for various error screens. If a match is found, the script 402 can determine what actions to take to resolve the error.

In aspects, the script 402 can be interactive. For example, the script 402 can interact with an administrator of the system by prompting the administrator to provide additional input before the script 402 can perform the error correction. For example, the script 402 can prompt the administrator to provide additional information about data or a location of data that is needed before it can perform the error correction. For example, the script 402 can request the administrator provide a location of error logs so that the script 402 can parse the error logs to look for specific data related to the error displayed. The script 402 can also request a number of days of error logs to look through, or a specific error code to look for, etc.

In aspects, in the situation where an error is detected, similar to the scenario where no error is detected, a signal and/or message can be generated and sent to a log file or displayed to an administrator implementing the system indicating an error is detected. In FIG. 4B, function call 404 is an example function that can generate the signal and/or message.

It has been discovered that the above embodiments provide a novel way to detect and correct errors in that they only use the GUI screens to detect whether the mobile device is in an error state through segmenting any given GUI screen to determine what the screen indicates, and whether the GUI screen maps to an expected screen. The novelty lies in that the embodiments implement a way to resolve the outstanding issues of relieving the burden on help desk/IT professionals to resolve errors, and they do so in an independent and autonomous way. The embodiments avoid using OS components that may be restricted. Thus, the system, method, and non-transitory computer readable media can be detached from dependencies needed for error detection (e.g., can be independent of the OS to detect errors). This is a benefit because error detection and correction can be done as a self-contained process and can be wholly controlled by the administrator of the system via the MDM software of the mobile device.

Methods of Operation

Figure 5:
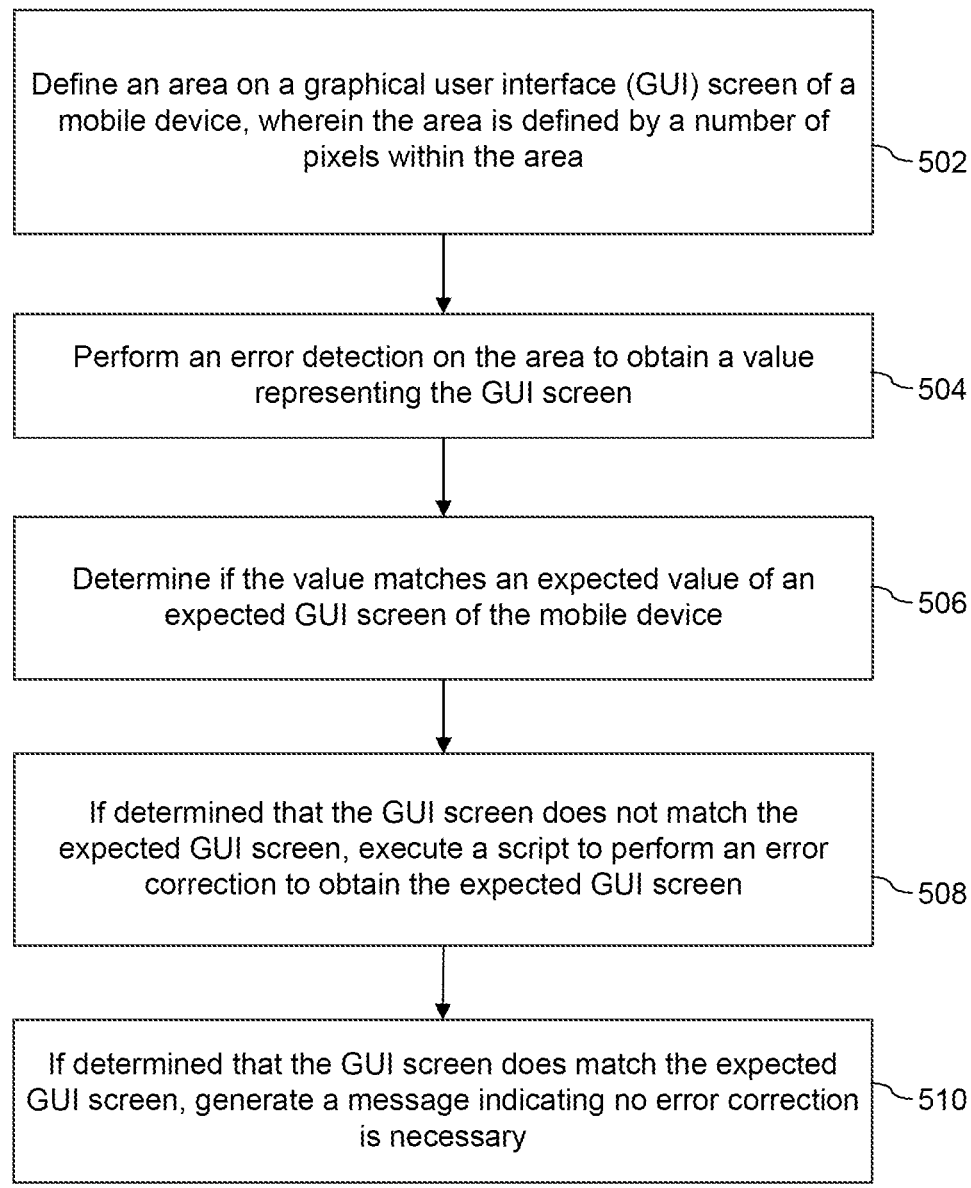
FIG. 5 shows a method of operating the system, according to aspects.

FIG. 5 shows a method 500 of operating the system, according to aspects. As shown in step 502, method 500 includes defining, by one or more computing devices of a mobile device (e.g., processor 202 of ring scanner 112), an area 302 on a graphical user interface (GUI) screen of the mobile device, wherein the area 302 is defined by a number of pixels within the area 302. At step 504 a cyclic redundancy check can be performed on the area 502 to obtain a value 308 representing the GUI screen. At step 506 it can be determined if the value 308 matches an expected value of an expected GUI screen of the mobile device. If determined that the GUI screen does not match the expected GUI screen a script 402 is executed to perform an error correction, as shown in step 508. If determined that the GUI screen does match the expected GUI screen a message and/or signal can be generated indicating no error correction is necessary, as shown in step 510. The operations of method 500 can be performed by ring scanner 112 in accordance with aspects described above.

The above detailed description and aspects of the disclosed embodiments are not intended to be exhaustive or to limit the disclosed embodiments to the precise form disclosed above. While specific examples are described above for illustrative purposes, various equivalent modifications are possible within the scope of the disclosure, as those skilled in the relevant art will recognize. For example, while processes and methods are presented in a given order, alternative implementations may perform routines having steps, or employ systems having processes or methods, in a different order, and some processes or methods may be deleted, moved, added, subdivided, combined, or modified to provide alternative or sub-combinations. Each of these processes or methods may be implemented in a variety of different ways. Also, while processes or methods are at times shown as being performed in series, these processes or blocks may instead be performed or implemented in parallel, or may be performed at different times.

The resulting system, method, non-transitory computer readable media is cost-effective, highly versatile, and accurate, and may be implemented by adapting components for ready, efficient, and economical manufacturing, application, and utilization. Another important aspect of an aspect of the present disclosure is that it valuably supports and services the historical trend of reducing costs, simplifying systems, and increasing performance.

These and other valuable aspects of the aspects of the present disclosure consequently further the state of the technology to at least the next level. While the disclosed aspects have been described as the best mode of implementing the embodiments, it is to be understood that many alternatives, modifications, and variations will be apparent to those skilled in the art in light of the descriptions herein. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A computer implemented method for error detection and correction on a mobile device comprising:
    defining, by one or more computing devices of the mobile device, an area on a graphical user interface (GUI) screen of the mobile device, wherein the area is defined by a number of pixels within the area;
    performing an error detecting function on the area to obtain a value representing the GUI screen;
    determining whether the value matches an expected value generated by applying the error detecting function to an expected GUI screen of the mobile device;
    when the value is determined not to match the expected value, executing a script to perform an error correction;
    wherein the script performs one or more actions to perform the error correction; and
    wherein the one or more actions comprise: deleting, reinstalling, pausing, or restarting software programs on the mobile device to perform the error correction.

2. The method of claim 1, further comprising:
    when the value is determined to match the expected value, generating a signal indicating no error correction is necessary.

3. The method of claim 1, wherein the error detecting function is a cyclic redundancy check (CRC).

4. The method of claim 1, wherein the script is interactive.

5. The method of claim 1, wherein the script prompts an administrator for an input.

6. The method of claim 5, wherein the input is used to perform the error correction.

7. The method of claim 1, wherein the script is stored on the mobile device and executed by a mobile device management (MDM) software of the mobile device.

8. The method of claim 1, wherein the mobile device is: a ring scanner, a mobile phone, or a tablet computer.

9. The method of claim 1, further comprising classifying the value by mapping the value to a textual description of the GUI screen.

10. A non-transitory computer readable medium storing instructions for error detection and correction on a mobile device that when performed by one or more computing devices of the mobile device, cause the one or more computing devices to perform operations comprising:

defining an area on a graphical user interface (GUI) screen of the mobile device, wherein the area is defined by a number of pixels within the area;

performing an error detecting function on the area to obtain a value representing the GUI screen;

determining whether the value matches an expected value generated by applying the error detecting function to an expected GUI screen of the mobile device;

when the value is determined not to match the expected value, executing a script to perform an error correction;

wherein the script performs one or more actions to perform the error correction; and wherein the one or more actions comprise: deleting, reinstalling, pausing, or restarting software programs on the mobile device to perform the error correction.

11. The non-transitory computer readable medium of claim 10, wherein the operations further comprise:

when the value is determined to match the expected value, generating a signal indicating no error correction is necessary.

12. The non-transitory computer readable medium of claim 10, wherein the error detecting function is a cyclic redundancy check (CRC).

13. The non-transitory computer readable medium of claim 10, wherein the script is interactive.

14. The non-transitory computer readable medium of claim 10, wherein the script prompts an administrator for an input.

15. The non-transitory computer readable medium of claim 14, wherein the input is used to perform the error correction.

16. The non-transitory computer readable medium of claim 10, wherein the script is stored on the mobile device and executed by a mobile device management (MDM) software of the mobile device.

17. The non-transitory computer readable medium of claim 10, wherein the mobile device is: a ring scanner, a mobile phone, or a tablet computer.

18. The non-transitory computer readable medium of claim 10, wherein the operations further comprise classifying the value by mapping the value to a textual description of the GUI screen.

19. A mobile device comprising:

a memory storing instructions; and one or more processors, coupled to the memory, configured to process the stored instructions to:

define an area on a graphical user interface (GUI) screen of the mobile device, wherein the area is defined by a number of pixels within the area;

perform an error detecting function on the area to obtain a value representing the GUI screen;

determine whether the value matches an expected value generated by applying the error detecting function to an expected GUI screen of the mobile device;

when the value is determined not to match the expected value, execute a script to perform an error correction;

wherein the script performs one or more actions to perform the error correction; and wherein the actions comprise: deleting, reinstalling, pausing, or restarting software programs on the mobile device to perform the error correction.

20. The mobile device of claim 19, wherein the one or more processors are further configured to:

when the value is determined to match the expected value, generate a signal indicating no error correction is necessary.

21. The mobile device of claim 19, wherein the error detecting function is a cyclic redundancy check (CRC).

22. The mobile device of claim 19, wherein the script is interactive.

23. The mobile device of claim 19, wherein the script prompts an administrator for an input.

24. The mobile device of claim 23, wherein the input is used to perform the error correction.

25. The mobile device of claim 19, wherein the script is stored on the mobile device and executed by a mobile device management (MDM) software of the mobile device.

26. The mobile device of claim 19, wherein the mobile device is: a ring scanner, a mobile phone, or a tablet computer.

27. The mobile device of claim 23, wherein the one or more processors are further configured to classify the value by mapping the value to a textual description of the GUI screen.

* * * * *

UNITED STATES PATENT AND TRADEMARK OFFICE
CERTIFICATE OF CORRECTION

PATENT NO. : 12,316,347 B2
APPLICATION NO. : 18/215965
DATED : May 27, 2025
INVENTOR(S) : Broderick Page 1 of 1

It is certified that error appears in the above-identified patent and that said Letters Patent is hereby corrected as shown below:

In the Claims

In Column 12, Claim 27, Line 39, delete "claim 23," and insert -- claim 19, --.

Signed and Sealed this
Twelfth Day of August, 2025

Coke Morgan Stewart
*Acting Director of the United States Patent and Trademark Office*